(12) United States Patent
Okamoto et al.

(10) Patent No.: US 7,211,527 B2
(45) Date of Patent: May 1, 2007

(54) RESIN-IMPREGNATED SUBSTRATE

(75) Inventors: Satoshi Okamoto, Tsukuba (JP); Shiro Katagiri, Tsukuba (JP); Wakana Aizawa, Chiyoda-ku (JP); Masatoshi Kito, Chiyoda-ku (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 243 days.

(21) Appl. No.: 11/028,654

(22) Filed: Jan. 5, 2005

(65) Prior Publication Data

US 2005/0181692 A1 Aug. 18, 2005

(30) Foreign Application Priority Data

Jan. 8, 2004 (JP) ............................. 2004-002704

(51) Int. Cl.
*B32B 5/02* (2006.01)
*B32B 27/02* (2006.01)

(52) U.S. Cl. ..................... 442/117; 442/110; 442/136; 442/164

(58) Field of Classification Search ............... 442/117, 442/110, 136, 164
See application file for complete search history.

(56) References Cited

U.S. PATENT DOCUMENTS

| | | | |
|---|---|---|---|
| 5,646,209 A * | 7/1997 | Furuta et al. ............... | 524/252 |
| 2005/0276975 A1* | 12/2005 | Katagiri et al. ............. | 428/357 |

FOREIGN PATENT DOCUMENTS

| | | |
|---|---|---|
| JP | 05-008224 A | 1/1993 |
| JP | 2004-244621 A | 9/2004 |

* cited by examiner

*Primary Examiner*—Lynda Salvatore
(74) *Attorney, Agent, or Firm*—Sughrue Mion, PLLC

(57) ABSTRACT

A resin-impregnated substrate is obtained by a method comprising the steps of immersing a sheet comprising an aromatic liquid crystalline polyester fiber in an aromatic liquid crystalline polyester solution containing 100 parts by weight of a solvent and 0.5 to 100 parts by weight of an aromatic liquid crystalline polyester and removing the solvent, the solvent containing on a weight basis with respect to the solvent 30% or more of a phenol compound. The resin-impregnated substrate has a high heat resistance in soldering conditions.

4 Claims, No Drawings

RESIN-IMPREGNATED SUBSTRATE

BACKGROUND OF THE INVENTION

1. Field of the Invention

The present invention relates to a resin-impregnated substrate.

2. Description of the Related Art

Recently, it is desired to develop an insulating resin substrate excellent in characteristics such as heat resistance, low hygroscopicity, dimensional stability and dielectric properties at high frequency, the substrate being used with a conductive layer thereon in electronic and electric equipment fields.

A conventionally known insulating resin substrate is a resin-impregnated substrate which is produced by impregnating glass cross with an epoxy resin (see, Japanese Unexamined Patent Application Publication No. 5-8224).

However, such a resin-impregnated substrate produced by impregnating glass cross with an epoxy resin is insufficient in heat resistance, while the substrate is often used with a lead-free solder which needs a higher temperature in soldering (for example, a temperature of 260° C. or higher). For example, the immersion of the resin-impregnated substrate in a solder bath at a temperature of 260° C. or higher may cause heat deterioration of the epoxy resin, which may result in distortion of the resin-impregnated substrate in some cases.

SUMMARY OF THE INVENTION

One of the objects of the present invention is to provide a resin-impregnated substrate having a high heat resistance at such a high temperature under soldering conditions.

The present invention provides a resin-impregnated substrate obtainable by a method comprising the steps of:

immersing a sheet comprising an aromatic liquid crystalline polyester fiber in an aromatic liquid crystalline polyester solution containing 100 parts by weight of a solvent and 0.5 to 100 parts by weight of an aromatic liquid crystalline polyester; and removing the solvent, the solvent containing on a weight basis with respect to the solvent 30% or more of a phenol compound expressed by Formula (I) below:

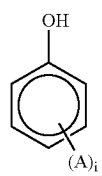

(I)

wherein A represents a halogen atom or a trihalogenated methyl group, i represents the number of A and is an integer of from 1 to 5, and when i is 2 or larger, a plurality of A are independent from each other.

The present invention also provides a resin-impregnated substrate with a conductive layer, which comprises the resin-impregnated substrate and a conductive layer placed on at least one side of the substrate.

In accordance with the present invention, a resin-impregnated substrate having a high heat resistance can be easily produced.

PREFERABLE EMBODIMENT OF THE INVENTION

A resin-impregnated substrate of the present invention is obtainable by immersing a sheet comprising an aromatic liquid crystalline polyester fiber cross in an aromatic liquid crystalline polyester solution and removing the solvent.

An aromatic liquid crystalline polyester to be used in the present invention may be a so-called thermotropic liquid crystalline polymer, which shows an optical anisotropy in melting at a temperature of 450° C. or lower.

Examples of the aromatic liquid crystalline polyester include:

(1) an aromatic liquid crystalline polyester obtained by polymerizing a combination of an aromatic hydroxycarboxylic acid, an aromatic dicarboxylic acid and an aromatic diol;

(2) an aromatic liquid crystalline polyester obtained by polymerizing different kinds of aromatic hydroxycarboxylic acids;

(3) an aromatic liquid crystalline polyester obtained by polymerizing a combination of an aromatic dicarboxylic acid and an aromatic diol;

(4) an aromatic liquid crystalline polyester obtained by reacting a crystalline polyester such as polyethylene terephthalate with an aromatic hydroxycarboxylic acid;

and the like.

The above-mentioned aromatic hydroxycarboxylic acid, aromatic dicarboxylic acid and aromatic diol may be exchanged with their derivatives having groups which can form esters thereof.

Examples of the derivatives of carboxylic acid compounds include a highly reactive derivative (such as a carboxylic acid chloride or a carboxylic acid anhydride) in which the carboxyl group therein can promote a polyester formation reaction; a derivative forming an ester with alcohols, ethylene glycol or the like, in which the carboxyl group therein can form a polyester by an ester-exchange reaction; and the like.

Examples of the derivatives having a phenoic hydroxyl group include a derivative with a phenolic hydroxyl group forming an ester with a carboxylic acid, in which the phenolic hydroxyl group therein can form a polyester by an ester-exchange reaction.

Alternatively, the aromatic hydroxylcarboxylic acid, aromatic dicarboxylic acid and aromatic diol may be those substituted with a halogen atom such as a chlorine atom and a fluorine atom, an alkyl group such as a methyl group and an ethyl group and an aryl group such as a phenyl group as long as the substitution does not adversely affect the ester formation thereof.

The aromatic liquid crystalline polyester may be composed of the repeating units shown below, but should not be construed as a limitation upon the scope of the present invention.

Examples of the repeating units which are derived from the aromatic hydroxylcarboxylic acids are as follows (in which the repeating units may be substituted with a halogen atom or an alkyl group):

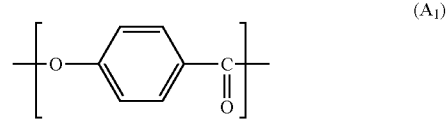

(A₁)

-continued

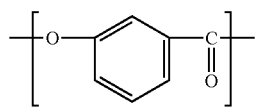

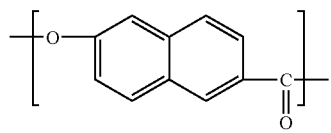

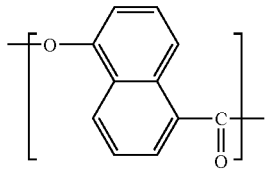

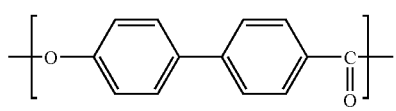

Examples of the repeating units derived from the aromatic dicarboxylic acids are as follows (in which the repeating units may be substituted with a halogen atom, an alkyl group or an aryl group):

(B₁)

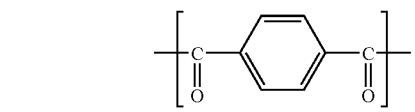

(B₂)

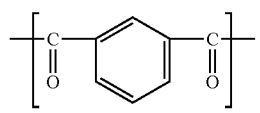

(B₃)

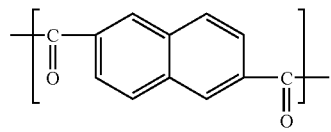

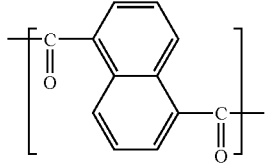

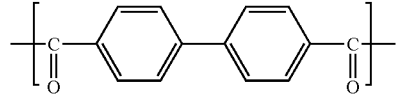

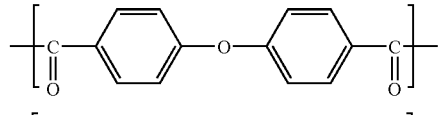

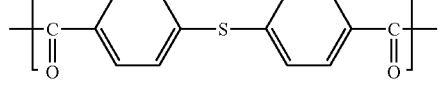

-continued (A₂)

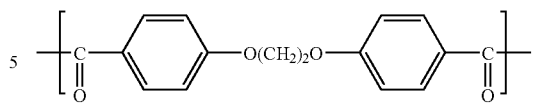

Examples of the repeating units derived from the aromatic diols are as follows (in which the repeating units may be substituted with a halogen atom, an alkyl group or an aryl group):

(C₁)

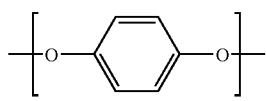

(C₂)

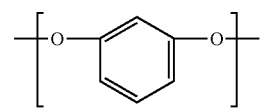

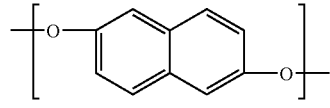

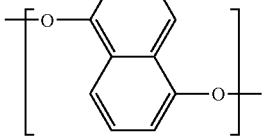

(C₃)

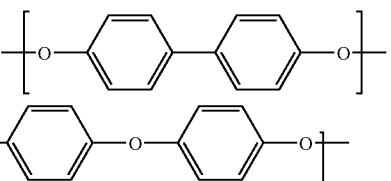

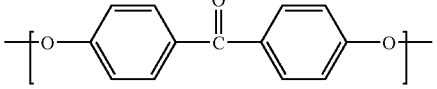

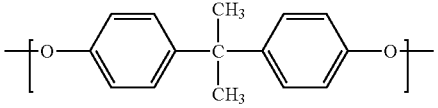

(C₄)

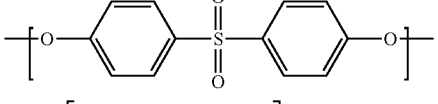

(C₅)

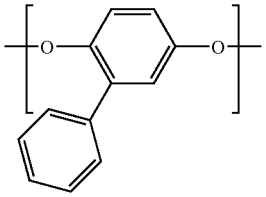

The aforementioned alkyl group is preferably an alkyl group having 1 to 10 carbon atom(s), and is more preferably a methyl group, an ethyl group or a butyl group. The aforementioned aryl group is preferably an aryl group having 6 to 20 carbon atoms, and is more preferably a phenyl group.

From the viewpoint of the balance of heat resistance and mechanical (physical) properties, the aromatic liquid crystalline polyester preferably contains at least 30% on the mole basis (with respect to the polyester) of the repeating unit expressed by the above Formula $A_1$.

Examples of the preferable combination of the repeating units include the following (a) to (f) combinations:

(a) Any combination selected from
a combination of repeating units ($A_1$), ($B_2$) and ($C_3$),
a combination of repeating units ($A_2$), ($B_2$) and ($C_3$),
a combination of repeating units ($A_1$), ($B_1$), ($B_2$) and ($C_3$), and
a combination of repeating structural units ($A_2$), ($B_1$), ($B_2$) and ($C_3$);

(b) A combination in which in the aforementioned combination (a), a portion or all of repeating unit ($C_3$) are replaced with repeating unit ($C_1$);

(c) A combination in which in the aforementioned combination (a), a portion or all of repeating unit ($C_3$) are replaced with repeating unit ($C_2$);

(d) A combination in which in the aforementioned combination (a), a portion or all of repeating unit ($C_3$) are replaced with repeating unit ($C_4$);

(e) A combination in which in the aforementioned combination (a), a portion or all of repeating unit ($C_3$) are replaced with repeating units ($C_4$) and ($C_5$); and (f) A combination in which in the aforementioned combination (a), a portion of repeating unit ($A_1$) is replaced with repeating unit ($A_2$).

In terms of heat resistance, the aromatic liquid crystalline polyester is preferably composed, with respect to the mole basis, of 30 to 80% of at least one repeating unit derived from at least one compound selected from the group consisting of p-hydroxybenzoic acid and 2-hydroxy-6-naphthoic acid, 10 to 35% of at least one repeating unit derived from at least one compound selected from the group consisting of hydroquinone and 4,4'-dihydroxybiphenyl and 10 to 35% of at least one repeating constitutional units derived from at least one compound selected from the group consisting of terephthalic acid and isophthalic acid.

The weight average molecular weight of the aromatic liquid crystalline polyester is not limited to, and is preferably in the range of from 10,000 to 100,000.

The method for producing the aromatic liquid crystalline polyester to be used in the present invention is not limited to. For example, the aromatic liquid crystalline polyester can be produced in a method comprising the steps of acylating at least one compound selected from the group consisting of aromatic hydroxycarboxylic acids and aromatic diols with an excess amount of a fatty acid anhydride to obtain an acylated compound, and then melt-polymerizing the resulting acylated compound with at least one compound selected from the group consisting of aromatic hydroxycarboxylic acids and aromatic dicarboxylic acids by ester exchange (polycondensation). In the method, a fatty acid ester obtained in advance by acylation may be utilized as the acylated compound.

In the acylation reaction, the fatty acid anhydride is preferably used in the amount of from 1 to 1.2 times the equivalent of the phenolic hydroxyl group, and is more preferably used in the amount of from 1.05 to 1.1 times the equivalent of the phenolic hydroxyl group. A smaller amount of the fatty acid anhydride may cause sublimation of the acylated compound, the aromatic hydroxycarboxylic acid and/or the aromatic dicarboxylic acid during ester exchange (polycondensation), which tends to clog lines (pipes) of the vessel for the reaction. On the other hand, an excess amount of the fatty acid anhydride may cause a remarkable coloring of the resulting aromatic liquid crystalline polyester.

The acylation reaction is preferably carried out at a temperature of 130 to 180° C. for 5 minutes to 10 hours, and is more preferably carried out at a temperature of 140 to 160° C. for 10 minutes to 3 hours.

The fatty acid anhydrides to be used in the acylation reaction is not limited to, and examples thereof include acetic anhydride, propionic anhydride, butylic anhydride, isobutylic anhydride, valeric anhydride, pivalic anhydride, diethylhexanoic anhydride, monochloroacetic anhydride, dichloroacetic anhydride, trichloroacetic anhydride, monobromoacetic anhydride, dibromoacetic anhydride, tribromoacetic anhydride, monofluoroacetic anhydride, difluoroacetic anhydride, trifluoroacetic anhydride, glutaric anhydride, maleic anhydride, succinic anhydride, β-bromopropionic anhydride, and the like. These may be used in a mixture of two or more kind of them. In terms of price and handling, acetic anhydride, propionic anhydride, butylic anhydride and isobutylic anhydride are preferably used, and acetic anhydride is more preferably used.

In the ester exchange (polycondensation), the amount of the acyl group of the acylated compound is preferably in the range of from 0.8 to 1.2 times the equivalent of the carboxyl group to be acylated.

The ester exchange is preferably carried out at a temperature of 130 to 400° C. while raising the temperature at a rate of 0.1 to 50° C. per minute, and is more preferably carried out at a temperature of 150 to 350° C. while raising the temperature at a rate of 0.3 to 5° C. per minute.

When a fatty acid ester obtained by acylation and a carboxylic acid are ester exchanged, a by-produced fatty acid and the unreacted fatty acid anhydride are distilled off to the outside of the reaction system by evaporation or the like, in order to move the equilibrium of the reaction to proceed the ester exchange reaction.

The acylation reaction and ester exchange may be carried out in the presence of a catalyst. The catalyst may a conventionally known catalyst for polymerization of polyester. Examples of the catalyst include metal salt catalysts such as magnesium acetate, tin(II) acetate, tetrabutyl titanate, lead acetate, sodium acetate, potassium acetate, and antimony trioxide; organic compound catalysts such as N,N-dimethylaminopyridine and N-methylimidazole. The catalyst may be introduced at the time of the introduction of monomers in the acylation reaction. After the acylation, the catalyst is not necessarily removed. Even when the catalyst is not removed, the ester exchange can be carried out on end.

The polycondensation by ester exchange may be conducted by melt polymerization, or may be conducted by melt polymerization and solid-phase polymerization in combination. The combination of melt polymerization and solid-phase polymerization is preferably carried out in a method comprising the steps of conducting a melt polymerization to obtain a polymer, taking the polymer out of the melt polymerization step, grinding the polymer to produce powders or flakes thereof and then carrying out a solid phase polymerization. The solid-phase polymerization can be carried out in a method comprising heat treating a polymer at a temperature of 20 to 350° C. for 1 to 30 hours in a solid-phase state of the ingredients under an inert atmosphere such as a nitrogen atmosphere. The solid-phase polymerization may be carried out with agitation or in a state allowed to stand without agitation. By utilizing a suitable agitation mechanism, the melt polymerization and solid-phase polymerization can be conducted in the same reaction vessel.

The above-mentioned production process of the aromatic liquid crystalline polyester can be conducted in a batch-wise manner or in a continuous manner.

In the present invention, a sheet comprising an aromatic liquid crystalline polyester fiber is immersed in an aromatic liquid crystalline polyester solution containing a solvent and an aromatic liquid crystalline polyester. The solvent contains on a weight basis with respect to the solvent 30% or more of a phenol compound expressed by Formula (I) below:

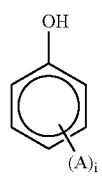

(I)

wherein A represents a halogen atom or a trihalogenated methyl group, i represents the number of A and is an integer of from 1 to 5, and when i is 2 or larger, a plurality of A are independent from each other (and therefore may be the same as or different from each other, but is preferably the same as each other). Integer i is preferably from 1 to 3, and is more preferably 1 or 2. When integer i is 1, the substitution position of A is preferably the position 4; and when integer i is 2 or more, at least one substitution position of A is preferably the position 4 (wherein the substitution position of the hydroxyl group is set to be the position 1).

The solvent can dissolve the aromatic liquid crystalline polyester at a room temperature (about 20° C.) or under heating.

The solvent preferably contains on a weight basis with respect to the solvent 60% or more of the phenol compound. More preferably, substantially a 100% by weight of the phenol compound is used as the solvent due to no need for mixing with other components for preparing the solvent.

Examples of the halogen atom as A in Formula (I) include a fluorine atom, a chlorine atom, a bromine atom and an iodine atom. A fluorine atom or a chlorine atom is preferred; and a chlorine atom is more preferred.

Examples of the phenol compound expressed by Formula (I) in which the halogen atom is a fluorine atom include pentafluorophenol, tetrafluorophenol, and the like.

Examples of the phenol compound expressed by Formula (I) in which the halogen atom is a chlorine atom include o-chlorophenol, p-chlorophenol and the like. From the viewpoint of solubility, p-chlorophenol is preferred.

Examples of a halogen atom in the trihalogenated methyl group as A in Formula (I) include a fluorine atom, a chlorine atom, a bromine atom and an iodine atom.

Examples of a halogen substituted phenol compound expressed by Formula (I) in which the halogen atom in the trihalogenated methyl group is a fluorine atom include 3,5-bistrifluoromethylphenol.

As the phenol compound in the present invention, a chlorine-substituted phenol compound such as o-chlorophenol and p-chlorophenol is preferably used from the viewpoint of price and availability; and p-chlorophenol is more preferably used from the viewpoint of solubility.

The solvent may further contains other components in addition to the above-mentioned phenol compound unless the components make the aromatic liquid crystalline polyester be precipitated during the storage of the solution or during flow casting described below.

Examples of such other components that may be contained therein include (but are not limited to) chlorine-based compounds such as chloroform, methylene chloride and tetrachloroethane.

In the present invention, a sheet comprising an aromatic liquid crystalline polyester fiber is immersed in an aromatic liquid crystalline polyester solution. The aromatic liquid crystalline polyester solution to be used in the present invention contains the aromatic liquid crystalline polyester in an amount of from 0.5 to 100 parts by weight based on 100 parts by weight of the aforementioned solvent. In terms of workability and economic efficiency, the solution preferably contains the aromatic liquid crystalline polyester in the amount of from 1 to 50 parts by weight, and more preferably in the amount of from 3 to 10 parts by weight, based on 100 parts by weight of the aforementioned solvent. A smaller amount of the aromatic liquid crystalline polyester tends to decrease production efficiency, while a larger amount thereof tends to make it difficult to dissolve the polyester in the solution.

The aromatic liquid crystalline polyester solution to be used in the present invention can be obtained by dissolving an aromatic liquid crystalline polyester in the aforementioned solvent. Before utilized, the solution is preferably filtrated by a filter or the like to remove fine foreign particles contained in the solution.

As long as not being adversely affected, the aromatic liquid crystalline polyester solution may further contain an inorganic filler such as silica, aluminum hydroxide and calcium carbonate; an organic filler such as a cured epoxy resin, a closslinked benzoguanamine resin and a closslinked acryl polymer; thermoplastic resins such as a polyamide, a polyester, polyphenylene sulfide, a polyether ketone, a polycarbonate, a polyether sulfone, a polyphenyl ether and modified products thereof, and a polyether imide; thermoset resins such as a phenol resin, an epoxy resin, a polyimide resin and a cyanate resin; various additives such as a silane coupling agent, an antioxidant, an ultraviolet absorbing agent. These optional ingredient may be contained two or more kinds of them.

In the present invention, a sheet comprising an aromatic liquid crystalline polyester fiber is immersed in the above-mentioned aromatic liquid crystalline polyester solution.

Examples of the sheet include a porous film, a textile, a knitted item, non-woven cross, and the like made of an aromatic liquid crystalline polyester fiber. The porous film may be produced by a uni-axial stretching process, a biaxial stretching process, a T-die process or the like. The non-woven cross may be produced by a dry process or a wet process.

The aromatic polyester fiber in the sheet can be made from at least one aromatic polyester such as the aforementioned aromatic polyester for preparing the aromatic polyester solution. As mentioned above, the aromatic polyester resin can be obtained by polymerizing an aromatic diol, an aromatic dicarboxylic acid, an aromatic hydroxycarboxylic acid, or a combination thereof. The aromatic polyester for making the aromatic polyester fiber and the aromatic polyester for preparing the aromatic polyester solution are independent on each other, and may be the same as or may be different from each other.

In the present invention, the sheet is immersed in the above-mentioned aromatic liquid crystalline polyester solution. The amount of the solution to be used for the immersion may be in the range of from one (1) to 1000 on the weight basis with respect to the sheet.

After the immersion, the solvent is removed out of the sheet, to produce a resin-impregnated substrate. The thickness of the sheet after removing the solvent may be in the range of from about 30 μm to about 200 μm.

The method of removing the solvent is not particularly limited, but the evaporation of the solvent is preferably carried out. The methods of evaporating the solvent include methods of heating, pressure reducing, blowing and the like.

The resultant resin-impregnated substrate may be, as required, subjected to a heat treatment.

The obtained resin-impregnated substrate may comprise the sheet and the aromatic liquid crystalline polyester resin, in which the ratio of the resin to the sheet may be in the range of from 10 to 90, is preferably in the range of from 20 to 80 and is more preferably in the range of from 40 to 60, on the weight basis.

The resulting resin-impregnated substrate may be used singly, or used by laminating another sheet, a film or the like. The method of the lamination is not particularly limited, and examples thereof include a method comprising the step of adhering another sheet, a film (membrane) or the like to the resin-impregnated substrate with an adhesive; a method comprising the step of heat fusion by means of heat pressing; and the like.

Here, the other sheets and films (membranes) to be laminated include, for example, a metal foil, a resin film and the like.

A resin-impregnated substrate in the present invention is preferably used with at least one conductive layer, in which the at least one conductive layer is placed on at least one side of the substrate. The resin-impregnated substrate with the conductive layer may obtained by a method comprising the step of laminating a metal film (foil) on a resin-impregnated substrate; a method comprising the step of coating metal powders or metal particles onto a resin-impregnated substrate to form a conductive layer thereon; and the like. Examples of such metal in the metal powders or metal particles include copper, aluminum and silver. In the coating method, copper is preferably used to prepare the conductive layer in terms of conductivity and cost.

Examples of the above-described laminating method include a method comprising the step of adhering a metal film (foil) to a resin-impregnated substrate by using an adhesive; and a method comprising the step of heat fusion by means of heat pressing. Examples of the above-described coating method include a method of coating metal powders or particles that may be utilized include a plating method, a screen printing method, a spattering method and the like.

The resin-impregnated substrate with the conductive layer can be used as a printed wiring board or the like. On a resulting printed wiring board may additionally be laminated a covering film in order to protect the conductive layer in the board.

In accordance with the present invention, a resin-impregnated substrate having a high heat resistance in soldering conditions can be obtained. The resin-impregnated substrate obtained by the present invention has a small dielectric loss tangent even in high frequency regions, and therefore, is excellent as an insulation resin substrate, while the frequency applied in the recent information communication equipment field is increasing more and more (100 MHz or more) these days. In addition, a resin-impregnated substrate with a conductive layer, which comprises the resin-impregnated substrate obtained in the present invention and at least one conductive layer placed on at least one side of the substrate, can favorably used for multi-layer printed wiring boards in a cellular phone, a semiconductor package, a mother board and the like; and for printed wiring boards such as a flexible printed wiring board and a rigid printed wiring board. These applications are based on the excellent characteristics of the resin-impregnated substrate, such as a low hygroscopicity and a high dimensional stability derived from an aromatic liquid crystalline polyester, in addition to the characteristic of a high heat resistance to solder.

The invention being thus described, it will be apparent that the same may be varied in many ways. Such variations are to be regarded as within the spirit and scope of the invention, and all such modifications as would be apparent to one skilled in the art are intended to be within the scope of the following claims.

The entire disclosure of the Japanese Patent Application No. 2004-2704 filed on Jan. 8, 2004, including specification, claims and summary, are incorporated herein by reference in their entirety.

EXAMPLE

The present invention is described in more detail by following Examples, which should not be construed as a limitation upon the scope of the present invention.

Example 1

(1) Preparation of Aromatic Liquid Crystalline Polyester:

A reaction vessel equipped with a stirring blade, a torque meter, a tube for introducing a nitrogen gas, a thermometer and a reflux condenser, was charged with 128 g (0.68 mol) of 2-hydroxy-6-naphthoic acid, 63.3 g (0.34 mol) of 4,4'-dihydroxybiphenyl, 56.5 g (0.34 mol) of isophthalic acid and 152.7 g (1.50 mol) of acetic anhydride. The air inside the reaction vessel is sufficiently replaced with a nitrogen gas, and then the temperature was increased to 150° C. over 15 minutes under the flow of the nitrogen gas. Reflux was conducted for 3 hours while maintaining the temperature.

Subsequently, the temperature was increased to 320° C. over 170 minutes while distilling off acetic acid as a by-product and an unreacted acetic anhydride. When torque for stirring the resulting mixture started to increase (at which the reaction can be regarded to reach end point), the mixture was discharged from the vessel in a molten state, and then was cooled down to room temperature to be solidified. The obtained solid material was coarsely crushed by a crusher. The obtained material was maintained at a temperature of 250° C. for 3 hours under a nitrogen atmosphere, to conduct a polymerization reaction in the solid phase. As a result, an aromatic liquid crystalline polyester powder was obtained. When observed by a polarization microscope at a temperature of 350° C., the powder showed a schrieren pattern, which is characteristic of a liquid crystal phase.

The obtained aromatic liquid crystalline polyester powder (0.4 g) was molded in a compression molding method under a load of 100 kg at a temperature of 250° C. for 10 minutes by means of a Flow Tester CFT-500 (manufactured by Shimadzu Corp.) to obtain a disc-like test piece having a thickness of 3 mm. Using the test piece, a water absorption of the aromatic liquid crystalline polyester was measured at 85° C./85% RH for 168 hours with a thermo-hygrostat ADVANTEC AGX Model (manufactured by Toyo Engineering Works.) As a result, the water absorption was found to be 0.1% or less.

Also, a dielectric loss tangent of the test piece was measured with an HP impedance analyzer. As a result, the dielectric loss tangent was found to be 0.0010 (1 GHz).

(2) Preparation of Aromatic Liquid Crystalline Polyester Resin Solution:

Into 9.5 g of p-chlorophenol, was added 0.5 g of the above-obtained aromatic liquid crystalline polyester powder. The resulting mixture was heated to a temperature of 120° C., to thereby obtain an aromatic liquid crystalline polyester resin solution in which the contents were completely dissolved therein.

(3) Preparation of Non-woven Cross Comprising Aromatic Liquid Crystalline polyester Fiber:

(i) An aromatic liquid crystalline polyester fiber made of 2-hydroxybenzoic acid and 2-hydroxy-6-naphthoic acid (70 parts by weight; trade name Vectran, produced by Kuraray Co., Ltd.; having a melting point of 320° C., a fineness of 1.7 dtex and a fiber length of 7 mm); and (ii) a pulp-like material (30 parts by weight; having a Canadian Standard freeness of 300 ml) which had been obtained by crushing with a refiner an aromatic liquid crystalline polyester fiber made of 2-hydroxybenzoic acid and 2-hydroxy-6-naphthoic acid (trade name Vectran, produced by Kuraray Co., Ltd.; having a melting point of 265° C., a fineness of 2.8 dtex and a fiber length of 10 mm;)

were used to prepare to a slurry. More specifically, the above-described aromatic liquid crystalline polyester fiber (i) and the above-described pulp-like material were dispersed together with a dispersing agent in water using a pulper, and further thereto was added a thickening agent, to prepare a uniform slurry. The slurry was wet papered using an inclined paper machine, to obtain a wet non-woven cross of 40.0 g/m². The wet non-woven cross was subjected to heat calendar treatment at a temperature of 170° C. under a line pressure of 100 kg/cm, and then the resulting cross was calcined at a temperature of 280° C. for 12 hours.

(4) Preparation of Resin-Impregnated Substrate:

The above-obtained non-woven cross made of an aromatic liquid crystalline polyester fiber was immersed in the aromatic polyester solution obtained in the above step (2), and then was heated using a hot plate with a setting temperature of 100° C. for one hour to evaporate p-chlorophenol to obtain a sheet in which the aromatic liquid crystalline polyester resin is impregnated. The dielectric loss tangent of the sheet was measured using an HP impedance analyzer. The dielectric loss tangent was found to be 0.0016 (1 GHz).

Further, the sheet was subjected to heat treatment at a temperature of 320° C. for one hour by a hot air drying machine, to obtain an aromatic liquid crystalline polyester resin-impregnated substrate having a thickness of 80 μm. The resulting aromatic liquid crystalline polyester resin-impregnated substrate was immersed in a solder bath at a solder temperature of 280° C. for one minute, and then the surface thereof was observed. The resin-impregnated substrate showed no deformations or swelling in the visual observation.

The dielectric loss tangent of the resin-impregnated substrate was measured using an HP impedance analyzer. The dielectric loss tangent was found to be 0.0005 (1 GHz).

Comparative Example 1

A sheet produced by impregnating glass cross with an epoxy resin (FR-4; manufactured by Hitachi Chemical Co., Ltd.; having a thickness of 800μ) was immersed in a solder bath at a solder temperature of 280° C. for one minute, and then the surface of the sheet was observed. The epoxy resin-impregnated sheet showed a partial heat degradation and also deformations of the substrate itself. The dielectric loss tangent of the epoxy resin-impregnated sheet was measured using an HP impedance analyzer. The dielectric loss tangent was found to be 0.012 (1 GHz).

What is claimed is:

1. A resin-impregnated substrate obtainable by a method comprising the steps of:
   immersing a sheet comprising an aromatic liquid crystalline polyester fiber in an aromatic liquid crystalline polyester solution containing 100 parts by weight of a solvent and 0.5 to 100 parts by weight of an aromatic liquid crystalline polyester; and
   removing the solvent, the solvent containing on a weight basis with respect to the solvent 30% or more of a phenol compound expressed by Formula (I) below:

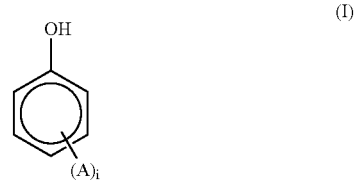

wherein A represents a halogen atom or a trihalogenated methyl group, i represents the number of A and is an integer of from 1 to 5, and when i is 2 or larger, a plurality of A are independent from each other.

2. A resin-impregnated substrate according to claim 1, wherein the sheet comprises an non-woven cross.

3. A resin-impregnated substrate with a conductive layer, which comprises the resin-impregnated substrate according to claim 1 or 2 and at least one conductive layer placed on at least one side of the substrate.

4. A resin-impregnated substrate with a conductive layer according to claim 3, which is used for a printed wiring board.

* * * * *